(12) United States Patent
Miyazaki (10) Patent No.: US 10,447,281 B2
(45) Date of Patent: Oct. 15, 2019

(54) PHASE ADJUSTING CIRCUIT, INVERTER CIRCUIT, AND POWER SUPPLY SYSTEM

(71) Applicant: SUMIDA CORPORATION, Chuo-ku, Tokyo (JP)

(72) Inventor: Hiroyuki Miyazaki, Natori (JP)

(73) Assignee: SUMIDA CORPORATION (JP)

( * ) Notice: Subject to any disclaimer, the term of this patent is extended or adjusted under 35 U.S.C. 154(b) by 0 days.

(21) Appl. No.: 15/889,683

(22) Filed: Feb. 6, 2018

(65) Prior Publication Data
US 2018/0287619 A1    Oct. 4, 2018

(30) Foreign Application Priority Data

Mar. 31, 2017  (JP) ................................ 2017-070730

(51) Int. Cl.
*H03L 7/085* (2006.01)
*H02M 7/5395* (2006.01)
(Continued)

(52) U.S. Cl.
CPC .......... *H03L 7/085* (2013.01); *H02M 7/5395* (2013.01); *H02M 7/53871* (2013.01);
(Continued)

(58) Field of Classification Search
CPC ............ H02M 7/00; H02M 7/42; H02M 7/44; H02M 7/48; H02M 7/53; H02M 7/537;
(Continued)

(56) References Cited

U.S. PATENT DOCUMENTS 5,345,193 A * 9/1994 Bradley ................. H03L 7/093
                                                       331/16
5,477,035 A   12/1995 Matsumoto et al.
(Continued)

FOREIGN PATENT DOCUMENTS

JP    2005-318509 A    11/2005

OTHER PUBLICATIONS

P. Lin et al., "Implementation of a PLL-based High Frequency Resonant AC Power Supply", The University Electro-Communications, Japan, Aug. 20-22, 2008.*
(Continued)

*Primary Examiner* — Gary L Laxton
*Assistant Examiner* — Carlos O Rivera-Perez
(74) *Attorney, Agent, or Firm* — Harness, Dickey & Pierce, P.L.C.

(57) ABSTRACT

A phase adjusting circuit is provided that can highly precisely adjust frequencies throughout the entire frequency range to be dealt with. A PLL circuit includes: a reference-signal input terminal from which a reference signal is input; a feedback-signal input terminal from which a feedback signal is input; and an output terminal from which an output signal based on a phase difference between the reference signal and the feedback signal is output. A filter circuit is connected to the reference-signal input terminal and the output terminal, and causes a phase of the reference signal to be delayed when the oscillation frequency of an inverter circuit including the PLL circuit falls in a high range. A delay circuit is connected to the output terminal, and causes the output signal to be delayed when the oscillation frequency of the inverter circuit falls in a low range lower than the high range.

12 Claims, 9 Drawing Sheets

(51) Int. Cl.
*H03L 7/093* (2006.01)
*H03L 7/107* (2006.01)
*H02M 7/5387* (2007.01)
*H02M 1/00* (2006.01)
*H02M 7/48* (2007.01)

(52) U.S. Cl.
CPC ............ *H03L 7/093* (2013.01); *H03L 7/1075* (2013.01); *H02M 7/5387* (2013.01); *H02M 2001/0025* (2013.01); *H02M 2007/4818* (2013.01); *Y02B 70/1441* (2013.01)

(58) Field of Classification Search
CPC ........... H02M 7/5387; H02M 7/53873; H02M 7/53875; H02M 7/5388; H02M 7/539; H02M 7/5395; H02M 7/53871; H02M 2007/4803; H02M 2007/4815; H02M 2007/4818; H02M 2007/53876; H02M 2007/53878; H02M 1/12; H02M 1/126; H02M 1/14; H02M 1/143; H02M 2001/0048; H02M 2001/0054; H02M 2001/0058; H02M 2001/0025; H02M 2001/0009; H03L 7/00; H03L 7/08; H03L 7/0807; H03L 7/081; H03L 7/0818; H03L 7/093; H03L 7/085; H03L 7/099; H03L 7/18; H03L 7/0992; H03L 7/0991; H03L 7/06; H03L 7/1075; Y02B 70/1416; Y02B 70/1441
USPC .... 363/15–21.03, 39–43, 47, 74, 79, 95–98, 363/123, 131–134; 323/205–214, 323/217–219, 235, 236, 266, 271–275, 323/280–286, 298, 304, 311–313, 351; 331/12, 16, 18, 23, 25, 36 R; 327/147–163
See application file for complete search history.

(56) References Cited

U.S. PATENT DOCUMENTS

2005/0099827 A1    5/2005  Sase et al.
2012/0039378 A1*   2/2012  Nakayama ............ H02M 3/337
                                                         375/226
2015/0205239 A1    7/2015  Kondo

OTHER PUBLICATIONS

Karaca H et al.: "Nonlinear Modeling and Analysis of Resonant Inverter Tuning Loops With Voltage-Pump Phase-Frequency Detector", IEEE Transactions on Power Electronics, Institute of Electrical and Electronics Engineers, USA, vol. 20, No. 5, Sep. 6, 2005 (Sep. 6, 2005), pp. 1100-1108, XP011138683.
Alireza Namadmalan et al.: "Self-Oscillating Switching Technique for Current Source Parallel Resonant Induction Heating Systems", Journal of Power Electronics, vol. 12, No. 6, Nov. 20, 2012 (Nov. 20, 2012), pp. 851-858, XP055267125.
Analog Devices: "Introduction to zero-delay clock timing techniques", Dec. 11, 2008 (Dec. 11, 2008), pp. 1-8, XP055494758, DOI: NA; Retrieved from the Internet: URL:http://www.analog.com/media/en/technical-documentation/application-notes/AN-0983.pdf [retrieved on Jul. 24, 2018].
Extended European Search Report for EP Application No. 18156322.2, dated Aug. 1, 2018, 8 pages.
Korean Office Action for KR-10-2017-0150404, dated Nov. 16, 2018 (10 pages).

* cited by examiner

PHASE ADJUSTING CIRCUIT, INVERTER CIRCUIT, AND POWER SUPPLY SYSTEM

BACKGROUND

Technical Field

The present invention relates to a phase adjusting circuit having a function of adjusting phases, and also relates to an inverter circuit and a power supply system, which use the phase adjusting circuit.

Related Art

Inverter circuits are used, for example, for motors or high-frequency power generators to generate alternating current with desired frequency from direct current or alternating current. In the case where the load connected to the inverter circuit is a resonant load, the resonant frequency of the load may change. In order to prevent a reduction in the conversion efficiency of the inverter circuit, the inverter circuit is provided with a circuit for adjusting oscillation frequencies so as to follow the resonant frequency of the load. A known circuit for adjusting oscillation frequencies is described, for example, in Japanese Patent Application Laid-open No. 2005-318509.

However, with the known method of adjusting oscillation frequency, in the case where the resonant frequency largely changes (for example, in the case where the resonant frequency changes from the minimum value to the maximum value within the variable frequency of an inverter), a gap arises between the oscillation frequency of the inverter circuit and the resonant frequency of the load, causing a problem of deterioration in conversion efficiency of the inverter circuit. Such a gap results from variations in performance of, for example, parts constituting the load, the inverter circuit, and the oscillation-frequency adjusting circuit itself, and the degree of the gap varies individually.

The present invention has been made in view of the points described above, and an object of the present invention is to provide a phase adjusting circuit, an inverter circuit, and a power supply system, which can highly precisely adjust frequencies throughout the entire range of frequencies to be dealt with.

SUMMARY

A phase adjusting circuit according to the present invention includes:
a phase synchronizing circuit including:
a reference-signal input terminal from which a reference signal is input;
a feedback-signal input terminal from which a feedback signal is input; and
an output terminal from which an output signal based on a phase difference between the reference signal and the feedback signal is output;
a first circuit that is connected to the reference-signal input terminal and the output terminal, and causes a phase of the reference signal to be delayed in a case where an oscillation frequency of a circuit main body including the phase synchronizing circuit falls in a first level; and
a second circuit that is connected to the output terminal, and causes the output signal to be delayed in a case where the oscillation frequency of the circuit main body falls in a second level that is lower than the first level.

An inverter circuit according to the present invention includes the phase adjusting circuit described above.

A power supply system according to the present invention includes the inverter circuit described above.

Effect of the Invention

It is possible to provide a phase adjusting circuit, an inverter circuit, and a power supply system, which can highly precisely adjust frequencies throughout the entire range of frequencies to be dealt with.

DETAILED DESCRIPTION

Hereinbelow, exemplary embodiment according to the present invention will be described with reference to the drawings. Note that, in all the drawings, the same reference characters are attached to similar constituent components, and detailed explanation thereof will not be repeated.

Figure 1:
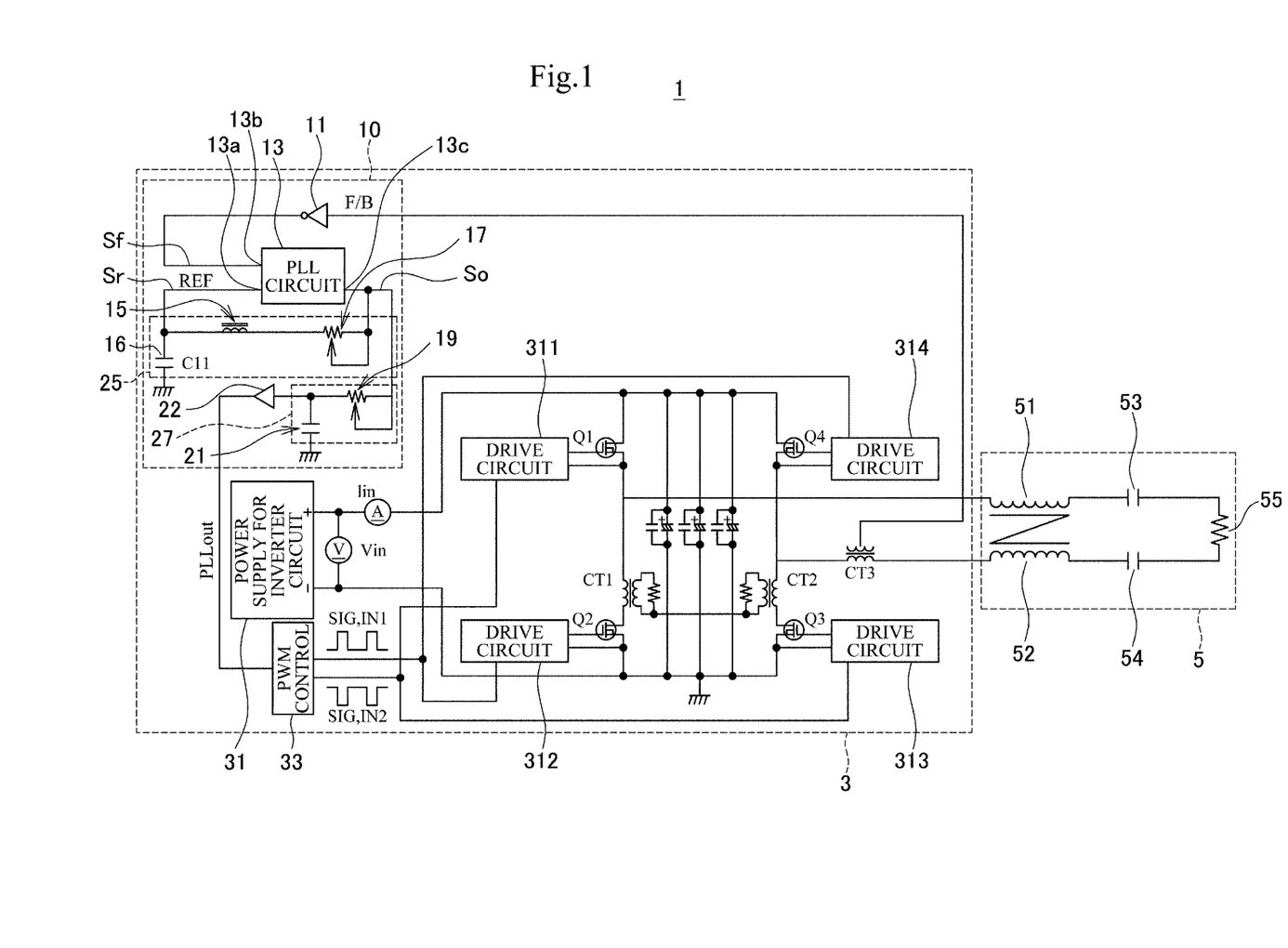
FIG. 1 is a diagram of a circuit schematically illustrating a phase adjusting circuit, an inverter circuit, and a power supply system according to an exemplary embodiment of the present invention.
Figure 2:
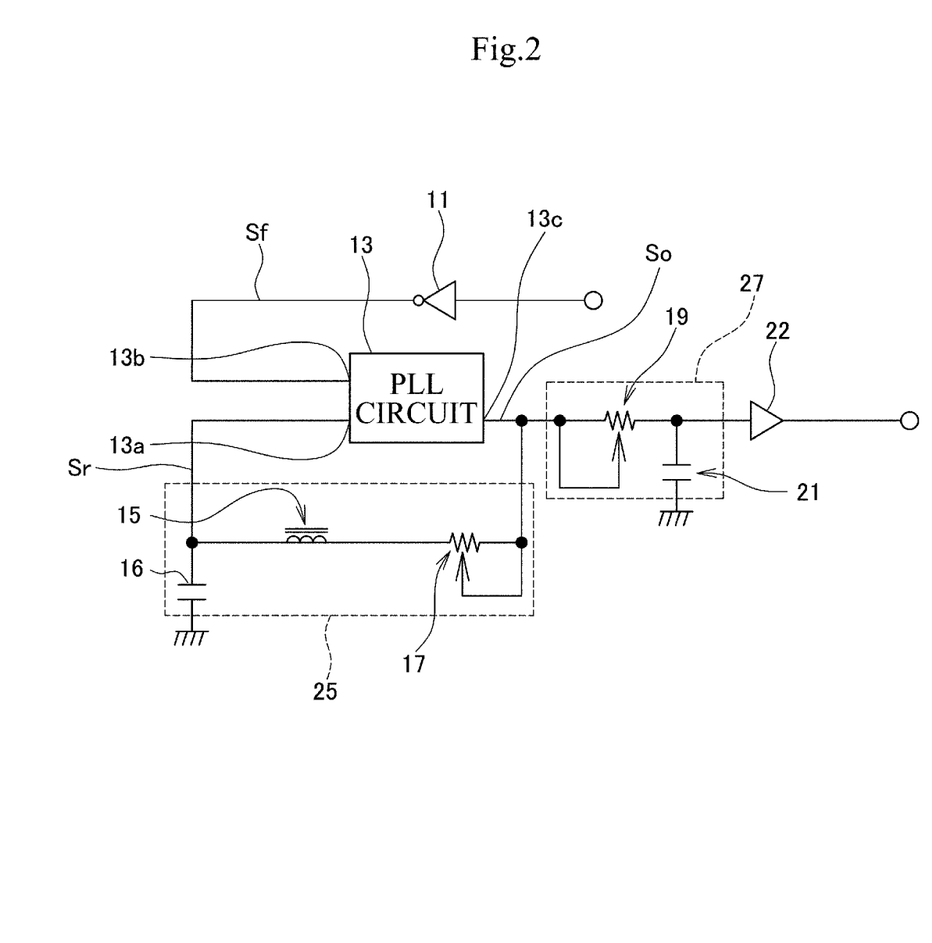
FIG. 2 is an enlarged diagram illustrating the phase adjusting circuit in FIG. 1.

FIG. 1 is a diagram of a circuit schematically illustrating a phase adjusting circuit 10, an inverter circuit 3, and a power supply system 1 according to an exemplary embodiment of the present invention. FIG. 2 is a diagram in which the phase adjusting circuit 10 in FIG. 1 is enlarged. Below, the power supply system 1, the inverter circuit 3, and the phase adjusting circuit 10 will be sequentially described.

Power Supply System

The power supply system 1 illustrated in FIG. 1 is a field coupling non-contact power supply system. The power supply system 1 includes the inverter circuit 3, the phase adjusting circuit 10, and a load 5.

The load 5 includes resonant coils 51 and 52, resonant capacitors 53 and 54, and a resistance element 55. The resonant frequency of the load 5 is determined by inductances of the resonant coils 51 and 52 and capacitances of the resonant capacitors 53 and 54. The power supply system 1 supplies electric power through the resistance element 55.

In the case where the load 5 is under certain conditions, the capacitances of the resonant capacitors 53 and 54 are known to change linearly with current flowing through the load 5. In addition, in the case of the power supply system 1, which is a non-contact power supply system, the values of the resonant capacitors 53 and 54 change according to contact states between the power supply system 1 and a device that receives the power supply. With the power supply system 1 according to this exemplary embodiment, it is possible to highly precisely follow resonant-frequency changes resulting from the above-described factors other than errors in functionality of each element, and always achieve an inverter circuit with high conversion efficiency.

Inverter Circuit

The inverter circuit 3 includes the phase adjusting circuit 10. In addition to the phase adjusting circuit 10, the inverter circuit 3 further includes: drive circuits 311, 312, 313, and 314 that convert the DC electric power supplied from a power supply 31 for inverter circuit, into high-frequency alternating current; and a pulse width modulation (PWM) control circuit 33 that controls the drive circuits 313, 312, 313, and 314. In this exemplary embodiment, the power supply 31 for inverter circuit supplies DC voltage and direct current.

The inverter circuit 3 is an element that can vary oscillation frequencies, and vary, within a predetermined range, frequencies (oscillation frequencies) after conversion by the drive circuits 311, 312, 313, and 314. In this exemplary embodiment, the inverter circuit 3 is an element that can vary the oscillation frequency in a range, for example, from 1.5 MHz to 2.0 MHz.

Phase Adjusting Circuit

As illustrated in FIGS. 1 and 2, the phase adjusting circuit 10 includes a phase locked loop (PLL) circuit 13 that serves as a phase synchronizing circuit. The PLL circuit 13 includes a reference-signal input terminal 13a from which a reference signal (REF) Sr is input, a feedback-signal input terminal 13b from which a feedback signal (F/B) Sf is input, and an output terminal 13c from which an output signal (PLLout) So based on a phase difference between the reference signal and the feedback signal is output.

Furthermore, the phase adjusting circuit 10 includes a filter circuit 25 that serves as a first circuit. The filter circuit 25 is connected to the reference-signal input terminal 13a and the output terminal 13c, and causes the phase of the reference signal Sr to be delayed in the case where the oscillation frequency of a circuit main body including the PLL circuit 13 falls in a first level. In addition, the phase adjusting circuit 10 includes a delay circuit 27 that serves as a second circuit. The delay circuit 27 is connected to the output terminal 13c, and causes the output signal So to be delayed in the case where the oscillation frequency of the circuit main body falls in a second level that is lower than the first level.

In the configuration described above, the "circuit main body" is a circuit to be connected to the phase adjusting circuit 10, and in this exemplary embodiment, represents the inverter circuit 3 including the phase adjusting circuit 10. As described above, the inverter circuit 3 can vary frequencies in a range of 1.5 MHz to 2 MHz, and hence, the "first level" is set to 2 MHz, and the "second level" is set to 1.5 MHz.

The filter circuit 25 includes: a capacitive element 16 serving as a first capacitive element; a coil element 15; and a variable resistance element 17 serving as a first resistance element having variable resistance values. The filter circuit 25 is a RLC series circuit. The capacitive element 16 works to advance the phase of current of the output signal (PLLout) So by 90 degrees. The coil element 15 works to delay the phase of current of the output signal (PLLout) So by 90 degrees. In addition, the variable resistance element 17 varies the gain of RLC filter property. Whether the current advances or delays is determined by whether the inverse ($1/C\omega$) of the product $C\omega$ of the capacitance C of the capacitive element 16 and the angular velocity $\omega$ of current is greater or less than the product ($L\omega$) of the inductance L of the coil element 15 and the angular velocity $\omega$. Furthermore, the phase difference thereof is determined by the resistance value R of the resistance element. Moreover, by obtaining a vector synthesis of the resistance value R of the resistance element and the difference between $1/C\omega$ and $L\omega$, the direction of the resulting vector determines the phase of the current.

With the configuration described above, by making the inductance L of the coil element 15 in constant and varying the resistance value of the variable resistance element 17, it is possible to freely adjust the phase of the reference signal Sr in the filter circuit 25.

The delay circuit 27 includes a capacitive element 21 serving as a second capacitive element, and a variable resistance element 19 serving as a second resistance element having variable resistance values. In the delay circuit 27, the output signal So that has been input is delayed by a time constant $\tau$ determined on the basis of the capacitance of the capacitive element 21 and the resistance value R of the variable resistance element 19, and then, is output. Thus, with the delay circuit 27, by varying the resistance value of the variable resistance element 19, it is possible to change the time constant $\tau$, and delay the output signal So as appropriate to output it. The delayed signal is output through the buffer circuit 22 to the inverter circuit 3. The buffer circuit 22 is an element that serves as a main factor in delaying the feedback signal Sf.

Furthermore, the capacitive elements, the coil elements, and the variable resistance elements described above may have any configurations, provided that the filter circuit 25 and the delay circuit 27 each have a function of adjusting the phase of a signal.

Here, operations of the phase adjusting circuit 10 will be described. In the phase adjusting circuit 10, the reference signal Sr is input from the reference-signal input terminal 13a of the PLL circuit 13. In addition, the feedback signal Sf is input from the feedback-signal input terminal 13b. The PLL circuit 13 includes a phase comparator, a low-pass filter, a voltage controlling oscillator, and the like, each of which is not illustrated. The phase of the reference signal Sr and the phase of the feedback signal Sf are compared in the phase comparator of the PLL circuit 13, and the output signal So based on the difference thereof is output from the output terminal 13c. At this time, in the case of this exemplary embodiment, since the filter circuit 25 is provided, the reference signal Sr is delayed in the case where the resonant frequency of the load 5 falls in a range close to 2 MHz (high range). Thus, the phase comparator compares the phase of the delayed feedback signal Sf and the phase of the reference signal Sr.

Furthermore, since the output signal So passes through the delay circuit 27, the output signal So is delayed in the case where the resonant frequency of the load 5 falls in a range close to 1.5 MHz (low range). The delayed output signal So is split, and is input into the PLL circuit 13 from the reference-signal input terminal 13*a* as a reference signal Sr.

The output signal So is input from the buffer circuit 22 into the control circuit 33, and is used for follow-up control of frequency performed by the inverter circuit 3. The signal output from the inverter circuit 3 toward the load 5 is split. In a NOT circuit 11, the split signal is inverted, and is converted into pulse. Then, the signal is input into the PLL circuit 13 from the reference-signal input terminal 13*a* as a feedback signal Sf.

Through these operations, the phase adjusting circuit 10 can generate the output signal So based on a difference between the signal actually output toward the load 5 and the control signal output toward the control circuit 33. In addition, by repeating feedback controlling of the control circuit 33 so as to minimize the difference between these outputs, it is possible to make the frequency of the output signal So equal to the desired frequency.

Figure 3:
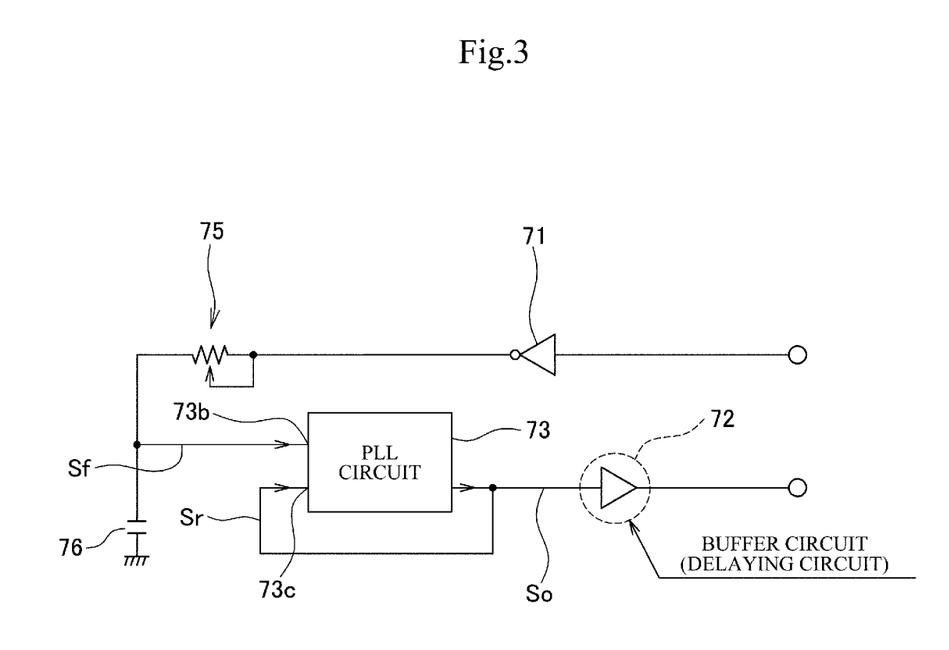
FIG. 3 is a diagram of a conventional phase adjusting circuit according to a comparative example to be compared with the phase adjusting circuit illustrated in FIG. 1.

Next, effects that the phase adjusting circuit 10 described above provides will be described using a comparative example. FIG. 3 is a diagram of a conventional phase adjusting circuit 70 (circuit according to a comparative example) to be compared with the phase adjusting circuit 10 according to this exemplary embodiment. The phase adjusting circuit 70 includes: a PLL circuit 73 including a reference-signal input terminal 73*a*, a feedback-signal input terminal 73*b*, and an output terminal 73*c*; a NOT circuit 71; a variable resistance element 75; a capacitive element 76; and a buffer circuit 72. As with the PLL circuit 13, in the case of the PLL circuit 73, the output signal So is split and is input into the reference-signal input terminal 73*a* as a reference signal Sr. The feedback signal is inverted and is converted into pulse. Then, the feedback signal is input from the feedback-signal input terminal 73*b* as a feedback signal Sf. In the phase adjusting circuit 70, the variable resistance element 75 and the capacitive element 76 form an RC circuit for adjusting phases of the pulse signal output from the NOT circuit 71.

Figure 4A:
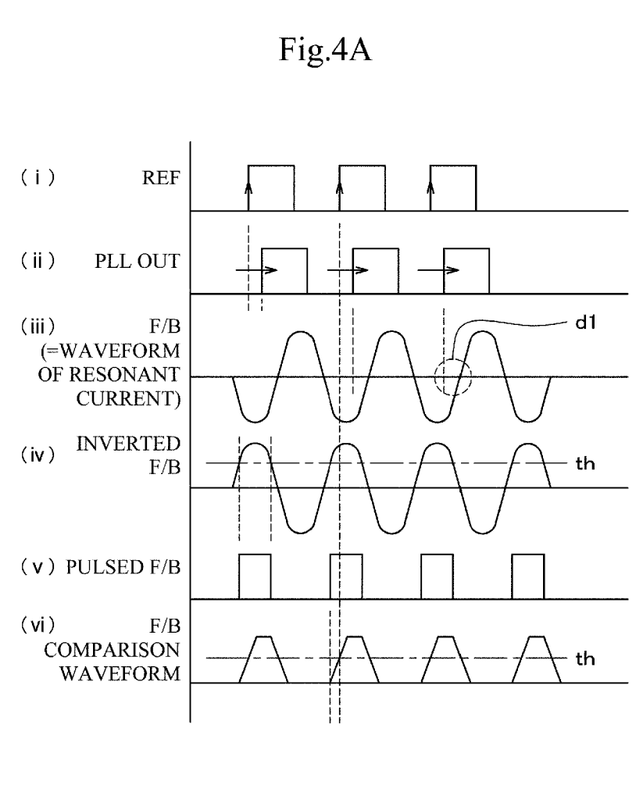
FIGS. 4A and 4B are diagrams each illustrating each signal flowing through the phase adjusting circuit illustrated in FIGS. 2 and 3.
Figure 4B:
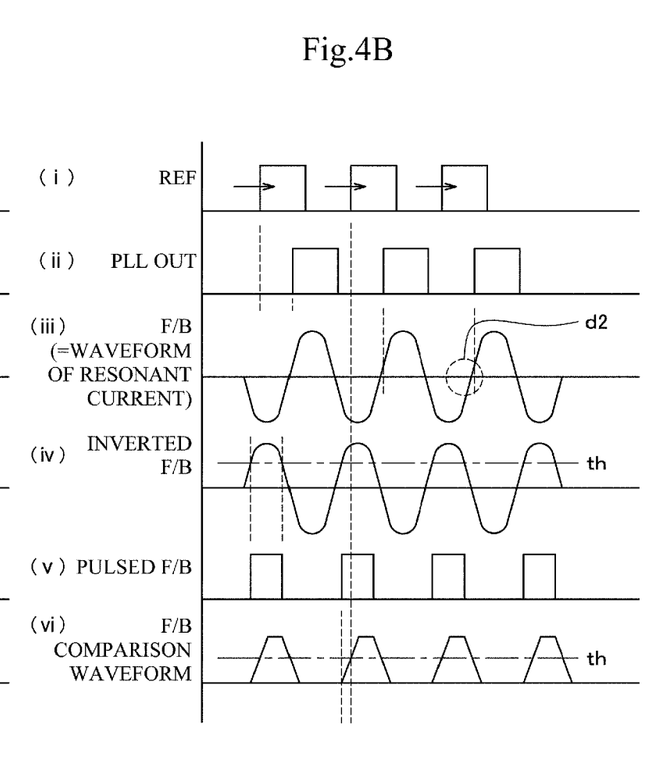

FIGS. 4A and 4B are diagrams each illustrating each signal flowing through the phase adjusting circuit 10 according to this exemplary embodiment. In each of FIGS. 4A and 4B, the horizontal axis represents the time, and the vertical axis relates to the reference signal Sr (i), the output signal So (PLL OUT, ii), the waveform of resonant current (feedback signal Sf before passing through the NOT circuit 11, iii), the inverted waveform of the waveform of resonant current (iv), the feedback signal Sf converted into pulse (v), and the feedback signal Sf to be compared in the PLL circuit 13 (F/B comparison waveform, vi).

The waveforms illustrated in FIG. 4A are obtained by connecting a simulated load to the inverter circuit 3, and making measurement with the resonant frequency of the simulated load being set to 1.5 MHz (low range). In addition, the waveforms illustrated in FIG. 4B are obtained by connecting a simulated load to the inverter circuit 3, and making measurement with the resonant frequency of the simulated load being set to 2.0 MHz (high range). FIG. 4A shows the signals measured in the low range, and FIG. 4B shows the signals measured in the high range.

First, problems that the conventional phase adjusting circuit 70 according to the comparative example has will be described with reference to FIGS. 4A and 4B. In each of the low range and the high range, phase differences exist between the reference signal Sr and the output signal So. Such phase differences result from errors or variations in functionality of elements constituting the buffer circuit 22 or the inverter circuit 3. In the PLL circuit 73, the feedback signal Sf (resonant current) is inverted, and is converted into pulse. At this time, if phase shift occurs between the output signal So and the resonant current, an error of the pulse width of the F/B pulse that has been converted into pulse occurs if the feedback signal Sf is compared with a certain threshold value th. If the error of the width of the F/B pulse occurs, this causes an error of the pulse width of the feedback signal Sf, deteriorating the follow-up performance in which the output signal So, which is generated in the PLL circuit 73 on the basis of the feedback signal Sf and the reference signal Sr, follows the resonant frequency. This deterioration in the follow-up performance of the phase adjusting circuit 70 reduces the efficiency in conversion of frequency by the inverter circuit, which is not favorable.

In view of the points described above, the phase adjusting circuit 10 according to this exemplary embodiment delays, in the low range, phases of the output signal So as illustrated in (ii) of FIG. 4A to make the phase of the output signal So matched with the phase of the feedback signal Sf (resonant current). This eliminates any error of the pulse width of the pulsed feedback signal Sf, and makes it possible to correctly compare phases between the feedback signal Sf and the reference signal Sr (output signal So) in the PLL circuit 13.

Phase of the output signal So is delayed by changing the resistance value of the variable resistance element 19 in the delay circuit 27. In this exemplary embodiment, the resistance value of the variable resistance element 19 is adjusted so that the difference d1 between the reference signal Sr and the waveform of resonant current illustrated in FIG. 4A is substantially zero. The difference d1 represents a difference between the rising edge of the output signal So and the zero cross point of the resonant current. The delay circuit 27 according to this exemplary embodiment adjusts phase so that the rise of the output signal So matches the zero cross point of the resonant current.

On the other hand, in the high range, the phase adjusting circuit 10 according to this exemplary embodiment delays phases of the reference signal Sr as illustrated in (i) of FIG. 4B to make the phase of the reference signal Sr matched with the phase of the feedback signal Sf (resonant current). This eliminates any error of the pulse width of the pulsed feedback signal Sf, and makes it possible to correctly compare phases between the feedback signal Sf and the reference signal Sr (output signal So) in the PLL circuit 13.

Phase of the reference signal Sr is delayed by changing the resistance value of the variable resistance element 17 in the filter circuit 25. In this exemplary embodiment, the resistance value of the variable resistance element 17 is adjusted so that the difference d2 between the feedback signal Sf and the waveform of resonant current illustrated in FIG. 4B is substantially zero. The difference d2 represents a difference between the rising edge of the reference signal Sr and the zero cross point of the resonant current. The filter circuit 25 according to this exemplary embodiment adjusts phase so that the rise of the reference signal Sr matches the zero cross point of the resonant current.

Figure 5:
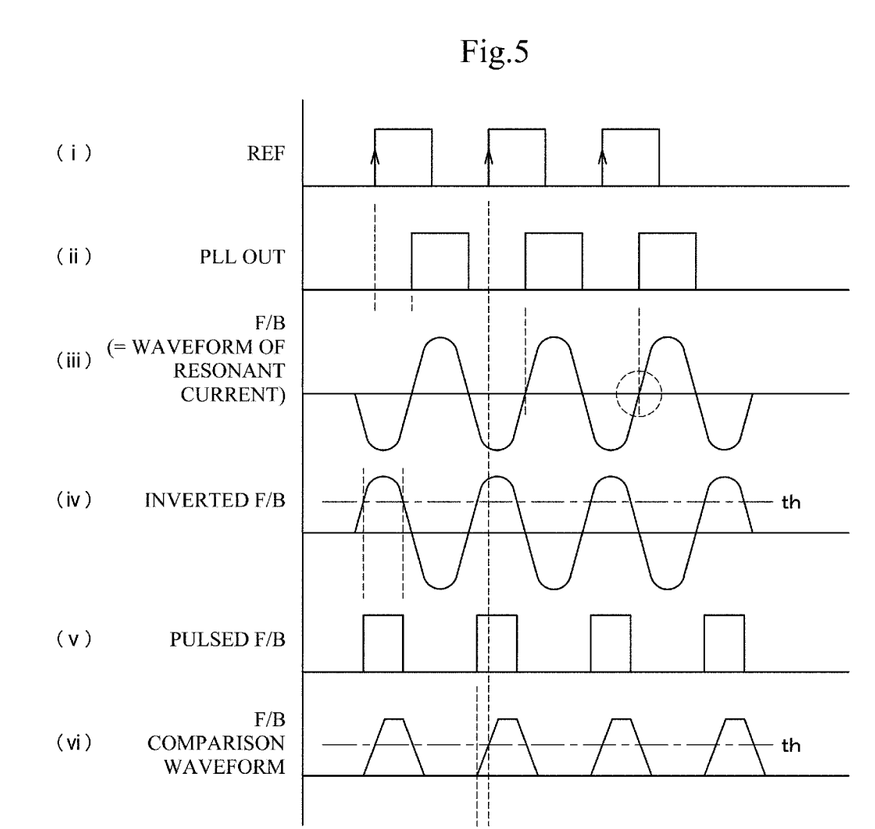
FIG. 5 is a diagram illustrating each signal that has been subjected to phase adjustment with the phase adjusting circuit illustrated in FIG. 2.

FIG. 5 is a diagram illustrating each signal flowing through the phase adjusting circuit 10 and obtained as a result of adjustment illustrated in FIG. 4A. In FIG. 5, the horizontal axis represents the time, and the vertical axis relates to the reference signal Sr (i), the output signal So (PLL OUT, ii), the waveform of resonant current (feedback signal Sf before passing through the NOT circuit 11, iii), the inverted waveform of the waveform of resonant current (iv), the feedback signal Sf converted into pulse (v), and the feedback signal Sf to be compared in the PLL circuit 13 (F/B comparison waveform, vi). As illustrated in FIG. 5, phases are matched between the reference signal Sr and the waveform of resonant current, and hence, the appropriate value of the waveform of resonant current is compared with the threshold value th. Thus, the pulse width of the F/B pulse illustrated in (iv) of FIG. 5 is maintained at appropriate time intervals.

Figure 6:
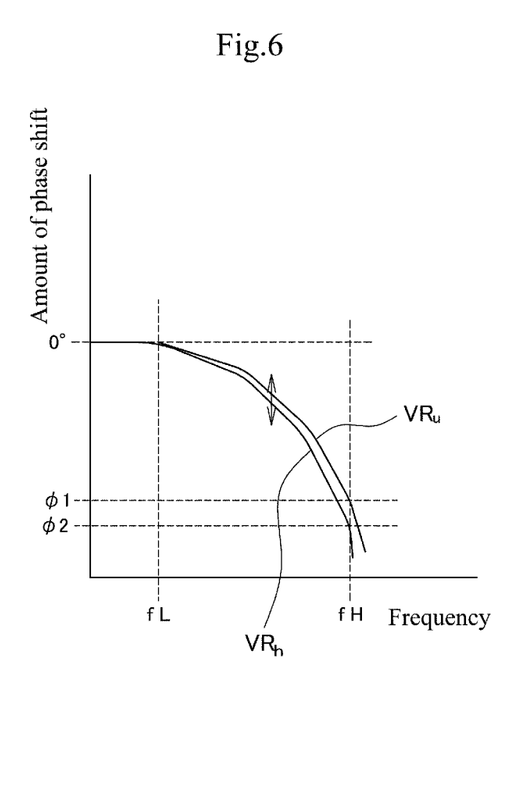
FIG. 6 is a graph illustrating a relationship between the oscillation frequency of an inverter circuit and the phase of feedback signals in a case where the resistance value of a variable resistance element in the filter circuit illustrated in FIG. 2 is changed.

FIG. 6 is a diagram illustrating a relationship between the oscillation frequency of the inverter circuit 3 and the phase of the feedback signal Sf in the case where the resistance value of the variable resistance element 17 in the filter circuit 25 is set to a high resistance value VRh and in the case where the resistance value of the variable resistance element 17 is set to a low resistance value VRu. In FIG. 6, the horizontal axis represents the oscillation frequency, and the vertical axis represents the phase of the feedback signal Sf. From FIG. 6, it can be understood that, in the case where the oscillation frequency falls in a relatively high range, the variable resistance element 17 in the filter circuit 25 can more effectively change the phase of the feedback signal Sf.

As described above, adjustment of the phase difference in the low range by the delay circuit 27 and adjustment of the phase difference in the high range by the filter circuit 25 are achieved by selection of the inductance of a coil or the capacitance of a capacitive element in the delay circuit 27 and the filter circuit 25, and setting of the resistance value of a variable resistance element.

In this exemplary embodiment, it is possible to obtain the frequency-conversion efficiency of equal to or more than 85% in both of the low range and the high range by setting the resistance value of the variable resistance element 17 to 100Ω, the resistance value of the variable resistance element 19 to 10Ω, the inductance of the coil element 15 to 120 µH, the capacitance of the capacitive element 21 to 100 pF, and the capacitance of the capacitive element 16 to 22 pF in the phase adjusting circuit 10 as illustrated, for example, in FIG. 2.

Figure 7:
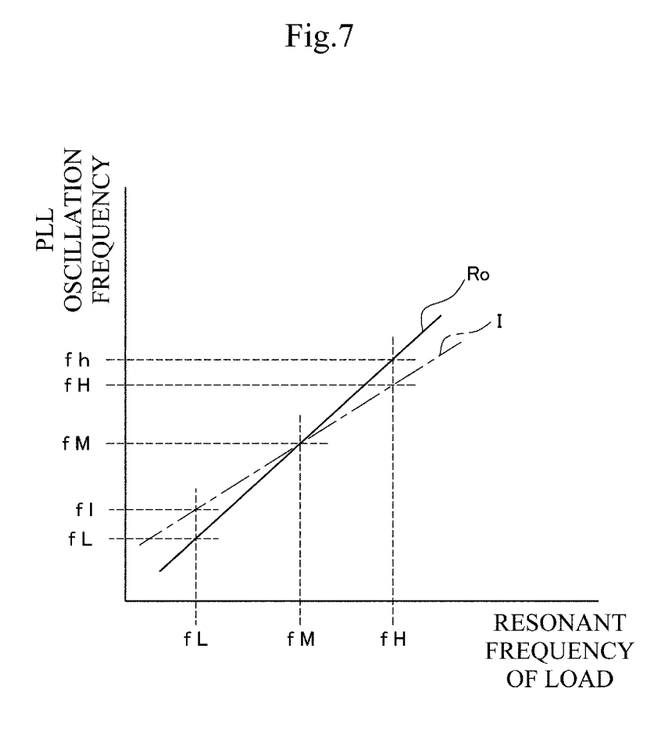
FIG. 7 is a graph illustrating a comparison between the oscillation frequency of the inverter circuit including the phase adjusting circuit illustrated in FIG. 3 and the resonant frequency of a load.
Figure 8:
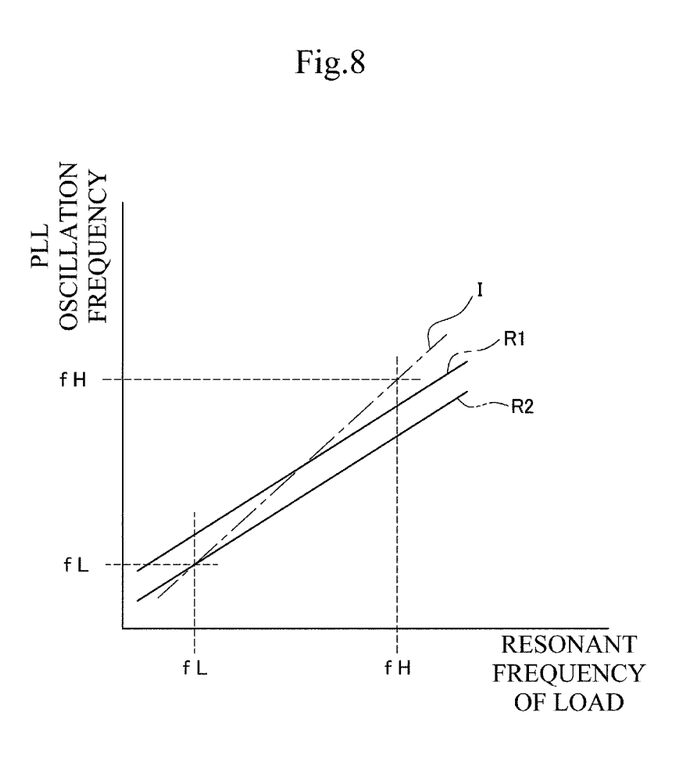
FIG. 8 is a graph illustrating a comparison between the oscillation frequency of the inverter circuit including the phase adjusting circuit illustrated in FIG. 2 and the resonant frequency of a load.

FIG. 7 is a graph illustrating a comparison between the oscillation frequency of the inverter circuit including the phase adjusting circuit 70 and the resonant frequency of a load. FIG. 8 is a graph illustrating a comparison between the oscillation frequency of the inverter circuit 3 including the phase adjusting circuit 10 and the resonant frequency of the load 5. In each of FIGS. 7 and 8, the horizontal axis represents the resonant frequency of the load and the vertical axis represents the oscillation frequency of the inverter circuit. If the resonant frequency is equal to the oscillation frequency, the inverter circuit can obtain the maximum frequency-conversion efficiency.

The line Ro illustrated in FIG. 7 indicates a relationship between the resonant frequency and the oscillation frequency, this relationship being actually obtained with the phase adjusting circuit 70. In addition, the line I indicates an ideal relationship between the resonant frequency and the oscillation frequency. By adjusting the variable resistance element 75 and the capacitive element C76 at the center frequency fM in the phase adjusting circuit 70, the resonant frequency and the oscillation frequency intersect at one point. However, differences occur between the line I and the line Ro in the low range as well as in the high range.

On the other hand, with the phase adjusting circuit 10 according to this exemplary embodiment, in the case where the actual property is set to the line R1 as illustrated in FIG. 8, the variable resistance element 19 is adjusted so as to minimize the difference in the low frequency range to obtain the property of the line R2, and the variable resistance element 17 is also adjusted so as to minimize the difference in the high frequency range. This makes it possible to bring the relationship closer to the ideal property I from the low frequency range to the high frequency range, as compared with the property of the conventional phase adjusting circuit 70.

Figure 9:
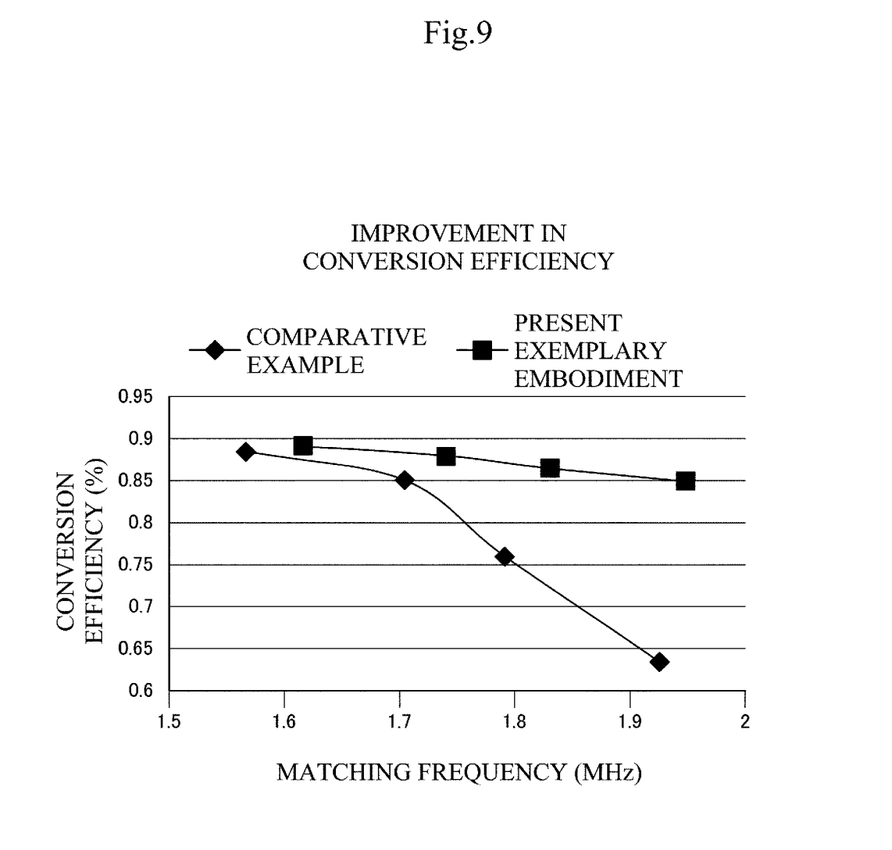
FIG. 9 is a graph illustrating, in a comparative manner, a relationship between the matching frequency and the conversion efficiency, which relate to the inverter circuit according to a comparative example and the inverter circuit according to the present exemplary embodiment.

FIG. 9 is a comparative graph illustrating a relationship between the matching frequency of the load 5 and the conversion efficiency, and relating to the inverter circuit (the circuit according to the comparative example) including the phase adjusting circuit 70 and the inverter circuit according to the present exemplary embodiment. In FIG. 9, the horizontal axis represents the matching frequency, and the vertical axis represents the conversion efficiency. In FIG. 9, the diamond plots relate to the inverter circuit that the phase adjusting circuit 70 includes, and the square plots relate to the inverter circuit 3 according to this exemplary embodiment. As can be clearly understood from FIG. 9, the inverter circuit 3 according to this exemplary embodiment can obtain the conversion efficiency higher than the circuit according to the comparative example from the low range to the high range.

More specifically, from FIG. 9, the conventional phase adjusting circuit 70 according to the comparative example can obtain a relatively high frequency-conversion efficiency of 85.5% at an oscillation frequency of 1.57 MHz. However, the frequency-conversion efficiency decreases toward the higher range as follows: a frequency-conversion efficiency of 85.1% at an oscillation frequency of 1.7 MHz; a frequency-conversion efficiency of 85.1% at an oscillation frequency of 1.7 MHz; a frequency-conversion efficiency of 76.1% at an oscillation frequency of 1.79 MHz; and a frequency-conversion efficiency of 63.6% at an oscillation frequency of 1.93 MHz. On the other hand, the phase adjusting circuit 10 according to this exemplary embodiment can obtain the high frequency-conversion efficiency from the low range to the high range as follows: a frequency-conversion efficiency of 89.2% at an oscillation frequency of 1.62 MHz; a frequency-conversion efficiency of 88% at an oscillation frequency of 1.74 MHz; a frequency-conversion efficiency of 86.5% at an oscillation frequency of 1.83 MHz; and a frequency-conversion efficiency of 85% at an oscillation frequency of 1.95 MHz.

As described above, with this exemplary embodiment, which can separately adjust the phase for each of the low range and the high range, it is possible to obtain a sufficiently high frequency follow-up performance from the low range to the high range.

These adjustments are performed at the time of inspection before the inverter circuit 3 or the power supply system 1 is shipped. The phase difference between the reference signal Sr and the feedback signal Sf varies from product to product, and hence, the amount of adjustment of the variable resistance elements 17 and 19 varies from product to product. Thus, it is desirable to adjust the variable resistance elements 17 and 19 for each product.

The exemplary embodiment and the example described above include the following technical ideas.

(1) A phase adjusting circuit including:
   a phase synchronizing circuit including:
   a reference-signal input terminal from which a reference signal is input;
   a feedback-signal input terminal from which a feedback signal is input; and
   an output terminal from which an output signal based on a phase difference between the reference signal and the feedback signal is output;

a first circuit that is connected to the reference-signal input terminal and the output terminal, and causes a phase of the reference signal to be delayed in a case where an oscillation frequency of a circuit main body including the phase synchronizing circuit falls in a first level; and a second circuit that is connected to the output terminal, and causes the output signal to be delayed in a case where the oscillation frequency of the circuit main body falls in a second level that is lower than the first level.

(2) The phase adjusting circuit according to (1), in which the first circuit is a filter circuit including a first capacitive element, a coil element, and a first resistance element having a variable resistance value.

(3) The phase adjusting circuit according to (1) or (2), in which the second circuit is a delay circuit including a second capacitive element and a second resistance element having a variable resistance value.

(4) An inverter circuit including the phase adjusting circuit according to any one of (1) to (3).

(5) A power supply system including the inverter circuit according to (4).

This application is based on Japanese Patent Application No. 2017-070730, filed on Mar. 31, 2017, the entire content of which is incorporated hereinto by reference.

The invention claimed is:

1. An inverter circuit comprising:
a phase adjusting circuit configured to adjust a phase of a current, the phase adjusting circuit including;
  a phase synchronizing circuit, the phase synchronizing circuit including:
    a reference-signal input terminal from which a reference signal is input;
    a feedback-signal input terminal from which a feedback signal is input; and
    an output terminal from which an output signal based on a phase difference between the reference signal and the feedback signal is output;
  a filter circuit that is connected to the reference-signal input terminal and the output terminal, the filter circuit being configured to receive the output signal and output the reference signal, and the filter circuit being configured to cause a phase of the reference signal to be delayed when an oscillation frequency of the inverter circuit falls to a first level; and
  a delay circuit that is connected to the output terminal, the delay circuit being configured to receive the output signal, and the delay circuit being configured to change a time constant so as to delay the output signal when the oscillation frequency of the inverter circuit falls to a second level that is lower than the first level, wherein the filter circuit includes:
  a first capacitive element configured to advance the phase of the current with respect to the output signal;
  a coil element configured to delay the phase of the current with respect to the output signal; and
  a first variable resistance element having a variable resistance value, the first variable resistance element being configured to vary a gain of the filter circuit, and the phase of the reference signal is determine by a capacitance value of the first capacitive element, an inductance value of the coil element, a resistance value of the first variable resistance element, and an angular velocity of the current.

2. The inverter circuit according to claim 1, wherein the delay circuit includes a second capacitive element and a second variable resistance element having a variable resistance value.

3. The inverter circuit according to claim 1, further comprising:
a drive circuit configured to convert a DC power into an alternating current; and
a control circuit configured to receive the output signal via the delay circuit, the control circuit being configured to control the drive circuit.

4. A power supply system comprising:
the inverter circuit according to claim 3; and
a load that is connected to the drive circuit, the load being configured to output electric power.

5. The power supply system according to claim 4, wherein the control circuit is a pulse width modulation control circuit.

6. The power supply system according to claim 4, wherein the first level is 2.0 MHz, and the second level is 1.5 MHz.

7. The power supply system according to claim 4, wherein a difference between the first level and the second level is ⅓ of the second level.

8. The inverter circuit according to claim 3, wherein the control circuit is a pulse width modulation control circuit.

9. The inverter circuit according to claim 3, wherein the first level is 2.0 MHz, and the second level is 1.5 MHz.

10. The inverter circuit according to claim 3, wherein a difference between the first level and the second level is ⅓ of the second level.

11. The inverter circuit according to claim 1, wherein the first level is 2.0 MHz, and the second level is 1.5 MHz.

12. The inverter circuit according to claim 1, wherein a difference between the first level and the second level is ⅓ of the second level.

* * * * *